US012641932B2

(12) United States Patent
Kim et al.

(10) Patent No.: US 12,641,932 B2
(45) Date of Patent: May 26, 2026

(54) DISPLAY DEVICE

(71) Applicant: LG Display Co., Ltd., Seoul (KR)

(72) Inventors: Il-Soo Kim, Goyang-si (KR); Yongseok Kwak, Paju-si (KR); Kyuoh Kwon, Paju-si (KR); Seungjun Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 724 days.

(21) Appl. No.: 17/979,600

(22) Filed: Nov. 2, 2022

(65) Prior Publication Data

US 2023/0215993 A1     Jul. 6, 2023

(30) Foreign Application Priority Data

Dec. 27, 2021     (KR) ........................ 10-2021-0188060

(51) Int. Cl.
H10H 20/851          (2025.01)
H10W 90/00          (2026.01)

(52) U.S. Cl.
CPC ........ H10H 20/8516 (2025.01); H10W 90/00 (2026.01)

(58) Field of Classification Search
CPC .............. H01L 25/0753; H10H 20/851; H10H 20/8512; H10H 20/8513; H10H 20/8516; H10H 20/8515; H10H 29/8515; H10H 29/851; H10H 29/8513; H10H 29/8514; H10W 90/10; H10W 90/15; H10W 90/00; H10K 59/35; H10K 59/351; H10K 59/352; H10K 59/353; H10K 59/124
See application file for complete search history.

(56) References Cited

U.S. PATENT DOCUMENTS

| | | | |
|---|---|---|---|
| 7,250,715 B2 | 7/2007 | Mueller et al. | |
| 8,916,887 B2 | 12/2014 | Kim | |
| 10,539,827 B2 | 1/2020 | Kim | |

(Continued)

FOREIGN PATENT DOCUMENTS

| | | | |
|---|---|---|---|
| KR | 10-2013-0043294 A | 4/2013 | |
| KR | 10-2019-0036577 A | 4/2019 | |

(Continued)

OTHER PUBLICATIONS

European Patent Office, Extended European Search Report and Opinion, EP Patent Application No. 22204675.7, May 8, 2023, eight pages.

(Continued)

*Primary Examiner* — Latanya N Crawford Eason
(74) *Attorney, Agent, or Firm* — Fenwick & West LLP

(57)          ABSTRACT

A display device according to an embodiment of the present disclosure includes a substrate on which a plurality of sub-pixels are defined, a plurality of LEDs disposed in each of the plurality of sub-pixels, and a plurality of color conversion layers covering the plurality of LEDs. The plurality of color conversion layers each include a plurality of color conversion material layers that are stacked to be spaced apart from each other. Accordingly, according to the present disclosure, it is possible to minimize or reduce light lost inside the color conversion layer by separating the plurality of color conversion material layers from each other, and improve color conversion efficiency and luminance.

21 Claims, 7 Drawing Sheets

(56) References Cited

U.S. PATENT DOCUMENTS

| | | | |
|---|---|---|---|
| 2011/0156071 A1 | 6/2011 | Cheng et al. | |
| 2011/0180780 A1 | 7/2011 | Yoo et al. | |
| 2013/0026500 A1 | 1/2013 | Kim | |
| 2013/0120967 A1 | 5/2013 | Liao | |
| 2019/0094624 A1 | 3/2019 | Kim | |
| 2019/0115508 A1* | 4/2019 | Lin | H10H 20/8515 |
| 2019/0378873 A1 | 12/2019 | Lee et al. | |
| 2020/0212267 A1 | 7/2020 | Kwak et al. | |
| 2021/0265540 A1 | 8/2021 | Itou et al. | |
| 2023/0307432 A1* | 9/2023 | Kim | H01L 25/167 |

FOREIGN PATENT DOCUMENTS

| | | |
|---|---|---|
| KR | 10-2021-0078766 A | 6/2021 |
| TW | 201123548 A | 7/2011 |
| TW | 201240152 A | 10/2012 |
| TW | 201306328 A | 2/2013 |
| TW | 201320412 A | 5/2013 |

OTHER PUBLICATIONS

Taiwan Intellectual Property Office, Office Action, Taiwanese Patent Application No. 111141380, Nov. 9, 2023, 16 pages.
Korean Intellectual Property Office, Office Action, Korean Patent Application No. 10-2021-0188060, Sep. 10, 2025, nine pages.

* cited by examiner

DISPLAY DEVICE

CROSS-REFERENCE TO RELATED APPLICATIONS

This application claims the benefit of and priority to Korean Patent Application No. 10-2021-0188060 filed on Dec. 27, 2021, in the Republic of Korea, the entire contents of which are hereby expressly incorporated by reference into the present application.

BACKGROUND

Technical Field

The present disclosure relates to a display device, and more particularly, to a display device using light emitting diodes (LEDs).

Discussion of the Related Art

Display devices used in computer monitors, TVs, and mobile phones include organic light emitting displays (OLEDs) that emit light by themselves, and liquid crystal displays (LCDs) that require a separate light source.

Such display devices are being applied to more and more various fields including not only computer monitors and TVs, but also personal mobile devices, and thus, display devices having a reduced volume and weight while having a wide active area are being studied.

In recent years, display devices including LEDs have received attention as next-generation display devices. Since the LED is formed of an inorganic material rather than an organic material, it has excellent reliability and has a longer lifespan compared to a liquid crystal display or an organic light emitting display. In addition, the LED has a high lighting speed, high luminous efficiency and excellent stability due to high impact resistance and can display a high luminance image.

SUMMARY

An aspect of the present disclosure is to provide a display device having improved luminance and color gamut at the same time.

Another aspect of the present disclosure is to provide a display device having improved color conversion efficiency of a color conversion layer.

Still another aspect of the present disclosure is to provide a display device having improved color gamut by minimizing leakage of blue light.

Objects of the present disclosure are not limited to the above-mentioned objects, and other objects, which are not mentioned above, can be clearly understood by those skilled in the art from the following descriptions.

A display device according to an embodiment of the present disclosure includes a substrate on which a plurality of sub-pixels are defined, a plurality of LEDs disposed in each of the plurality of sub-pixels, and a plurality of color conversion layers covering the plurality of LEDs. The plurality of color conversion layers each includes a plurality of color conversion material layers that are stacked to be spaced apart from each other. Accordingly, according to the present disclosure, it is possible to minimize or reduce light lost inside the color conversion layer by separating the plurality of color conversion material layers from each other, and improve color conversion efficiency and luminance.

A display device according to another embodiment of the present disclosure includes a substrate on which a plurality of sub-pixels including first emission areas and second emission areas are defined, LEDs disposed in the first emission areas, and color conversion layers covering the LEDs in the plurality of sub-pixels and each including a plurality of color conversion material layers spaced apart from each other. The first emission area overlaps all of the plurality of color conversion material layers. A partial area of the second emission area overlaps a portion of the plurality of color conversion material layers. Therefore, according to the present disclosure, color conversion efficiency of the color conversion layer can be improved by intensively disposing the color conversion material layer over the LED from which light is most strongly emitted.

Other detailed matters of the embodiments are included in the detailed description and the drawings.

According to the present disclosure, color gamut and luminance of a display device can be improved at the same time.

According to the present disclosure, color conversion efficiency of converting light into light of a different color in a color conversion layer can be improved.

According to the present disclosure, it is possible to minimize or reduce a decrease in luminance due to absorption and loss of light in the color conversion layer.

According to the present disclosure, it is possible to minimize or reduce leakage of blue light that is not converted in the color conversion layer.

According to the present disclosure, it is possible to minimize or reduce color coordinate distortion due to leakage of blue light or a decrease in light output efficiency in the color conversion layer, and improve luminance.

The effects according to the present disclosure are not limited to the contents exemplified above, and more various effects are included in the present specification.

DETAILED DESCRIPTION OF THE EMBODIMENTS

Figure 1:
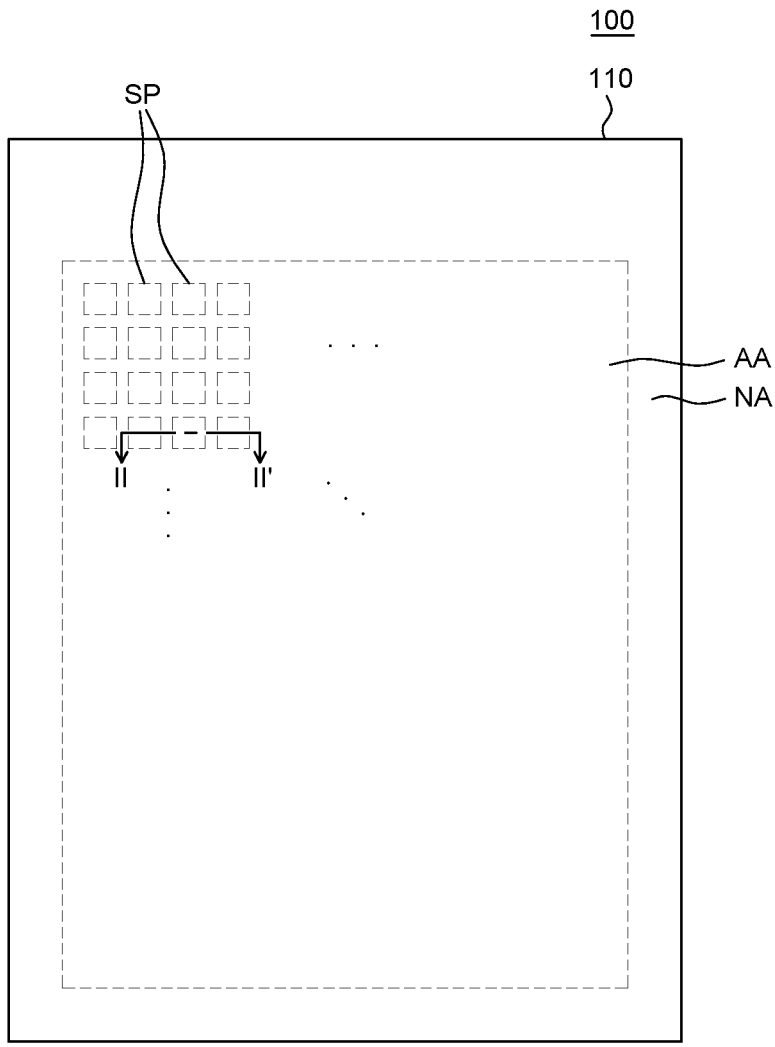
FIG. 1 is a schematic plan view of a display device according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, it may be directly on the another element or layer, or another layer or another element may be interposed therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Same reference numerals generally denote same elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to embodiments of the present disclosure will be described in detail with reference to accompanying drawings.

FIG. 1 is a schematic plan view of a display device according to an embodiment of the present disclosure. In FIG. 1, only a substrate 110 and a plurality of sub-pixels SP among various components of a display device 100 are illustrated for convenience of explanation.

The substrate 110 is a component for supporting various components included in the display device 100, and may be formed of an insulating material. For example, the substrate 110 may be formed of glass or resin. Also, the substrate 110 may include a polymer or plastic, or may be formed of a material having flexibility.

The substrate 110 includes an active area AA and a non-active area NA.

The active area AA is an area where the plurality of sub-pixels SP are disposed to display an image. A display element, a driving circuit for driving the display element and the like may be disposed in each of the plurality of sub-pixels SP of the active area AA. For example, an LED as a display element and a transistor for driving the LED may be disposed in each of the plurality of sub-pixels SP.

The non-active area NA is an area in which no image is displayed, and is an area in which various lines, driver ICs and the like for driving the sub-pixels SP disposed in the active area AA are disposed. For example, various ICs and driving circuits such as a gate driver IC and a data driver IC may be disposed in the non-active area NA. Meanwhile, the non-active area NA may be located on a rear surface of the substrate 110, that is, a surface on which the sub-pixel SP is not disposed, or may be omitted and is not limited to those illustrated in drawings.

The plurality of sub-pixels SP are defined in the active area AA of the substrate 110. Each of the plurality of sub-pixels SP is an individual unit emitting light, and an LED and a driving element are formed in each of the plurality of sub-pixels SP. For example, the plurality of sub-pixels SP may include a red sub-pixel, a green sub-pixel, a blue sub-pixel, and/or a white sub-pixel, but the present disclosure is not limited thereto. Hereinafter, for convenience of explanation, descriptions are made assuming that the plurality of sub-pixels SP includes a red sub-pixel, a green sub-pixel, and a blue sub-pixel.

Figure 2:
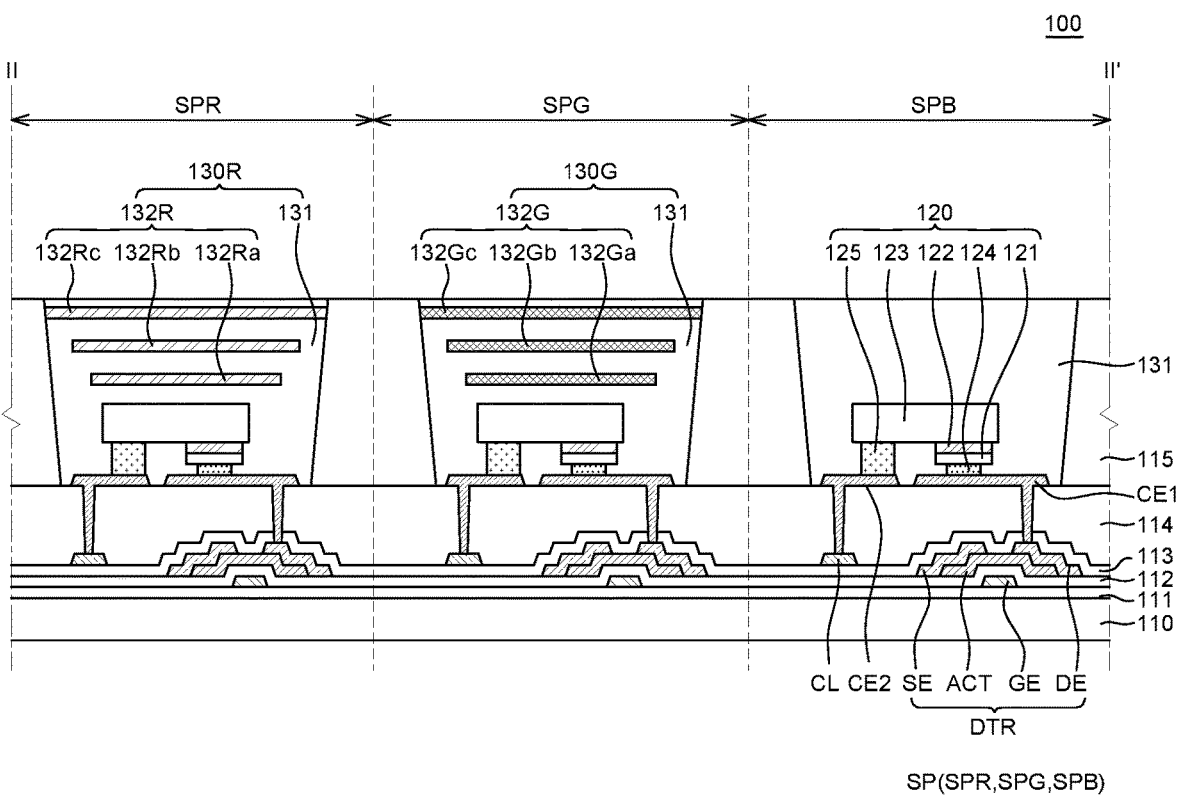
FIG. 2 is a cross-sectional view taken along II-II' of FIG. 1.

FIG. 2 is a cross-sectional view taken along II-II' of FIG. 1. Referring to FIG. 2, the display device 100 according to an embodiment of the present disclosure includes the substrate 110, a buffer layer 111, a gate insulating layer 112, a passivation layer 113, a planarization layer 114, banks 115, a driving transistor DTR, a common line CL, a first connection electrode CE1, a second connection electrode CE2, LEDs 120, and color conversion layers 130.

Referring to FIG. 2, a buffer layer 111 is disposed on the substrate 110. The buffer layer 111 may minimize or reduce diffusion of moisture or impurities from the substrate 110. The buffer layer 111 may be composed of a single layer or a multilayer of silicon oxide (SiOx) or silicon nitride (SiNx), but is not limited thereto.

The driving transistor DTR is disposed in each of the plurality of sub-pixels SP on the buffer layer 111. The driving transistor DTR is an element for driving the LED 120. The driving transistor DTR may be, for example, a thin film transistor (TFT), an N-channel metal oxide semiconductor (NMOS), a P-channel metal oxide semiconductor (PMOS), a complementary metal oxide semiconductor (CMOS), a field effect transistor (FET), or the like, but is not limited thereto. Hereinafter, descriptions are made assuming that the driving transistor DTR is a thin film transistor, but the present disclosure is not limited thereto.

The driving transistor DTR includes a gate electrode GE, an active layer ACT, a source electrode SE, and a drain electrode DE.

The gate electrode GE is disposed on the buffer layer 111. The gate electrode GE may be formed of a conductive material, for example, copper (Cu), aluminum (Al), molybdenum (Mo), titanium (Ti), or an alloy thereof, but is not limited thereto.

The gate insulating layer 112 is disposed on the gate electrode GE. The gate insulating layer 112 is a layer for insulating the gate electrode GE and the active layer ACT, and may be formed of an insulating material. For example, the gate insulating layer 112 may be composed of a single layer or a multilayer of silicon oxide (SiOx) or silicon nitride (SiNx), but is not limited thereto.

The active layer ACT is disposed on the gate insulating layer 112. The active layer ACT may be formed of, for example, an oxide semiconductor, amorphous silicon, poly-silicon or the like, but is not limited thereto.

The source electrode SE and the drain electrode DE that are spaced apart from each other are disposed on the active layer ACT. The source electrode SE and the drain electrode DE may be electrically connected to the active layer ACT. The source electrode SE and the drain electrode DE may be formed of a conductive material, for example, copper (Cu), aluminum (Al), molybdenum (Mo), titanium (Ti), or an alloy thereof, but the present disclosure is not limited thereto.

The passivation layer 113 is disposed on the driving transistor DTR. The passivation layer 113 is an insulating layer that protects components under the passivation layer 113. For example, the passivation layer 113 may be composed of a single layer or a multilayer of silicon oxide (SiOx) or silicon nitride (SiNx), but is not limited thereto.

The common line CL is disposed on the passivation layer 113. The common line CL is a line for driving a plurality of the LEDs 120 and may supply a common voltage to the plurality of LEDs 120. However, the common line CL may be disposed under the passivation layer 113, and an arrangement structure of the common line CL is not limited thereto.

The planarization layer 114 is disposed on the passivation layer 113. The planarization layer 114 may planarize an upper portion of the substrate 110 on which the driving transistor DTR is disposed. The planarization layer 114 may be composed of a single layer or a multilayer, and may be formed of an organic material. For example, the planarization layer 114 may be formed of an acryl-based organic material, but is not limited thereto.

The first connection electrode CE1 and the second connection electrode CE2 are disposed in each of the plurality of sub-pixels SP on the planarization layer 114. The first connection electrode CE1 is an electrode for connecting the driving transistor DTR and the LED 120. The second connection electrode CE2 is an electrode for electrically connecting the common line CL and the LED 120. For example, the first connection electrode CE1 and the second connection electrode CE2 may be formed of a conductive material, for example, tin oxide (TO), indium tin oxide (ITO), indium zinc oxide (IZO), indium tin zinc oxide (ITZO) or the like, or may be formed of a conductive material such as the gate electrode GE, the source electrode SE, and the drain electrode DE of the driving transistor DTR, but the present disclosure is not limited thereto.

The LED 120 is disposed in each of the plurality of sub-pixels SP on the first connection electrode CE1 and the second connection electrode CE2. The LED 120 is an element that emits light by electric current. The LEDs 120 include LEDs that emits red light, green light, blue light, and the like, and a combination thereof can implement light of various colors including white. In addition, light of various colors may be emitted through a combination of the LEDs 120 which emit light of the same color, and the color conversion layer 130 which converts light emitted from the LED 120 into light of a different color.

The plurality of LEDs 120 may emit light of different colors or may emit light of the same color. For example, when the plurality of LEDs 120 emit light of different colors, the LED 120 disposed in a red sub-pixel SPR among the plurality of sub-pixels SP may be an LED that emits red light. The LED 120 disposed in a green sub-pixel SPG among the plurality of sub-pixels SP may be an LED emitting green light. The LED 120 disposed in a blue sub-pixel SPB among the plurality of sub-pixels SP may be an LED emitting blue light. In addition, since each of the plurality of LEDs 120 emits light of different colors, a light conversion member such as the color conversion layer 130 may be omitted.

On the other hand, when the plurality of LEDs 120 emit light of the same color, the light emitted from each of the plurality of LEDs 120 may be converted to have various colors by using a light conversion member such as the color conversion layer 130 over each of the plurality of LEDs 120.

Hereinafter, descriptions are made that the plurality of LEDs 120 of the display device 100 according to an embodiment of the present disclosure are blue LEDs emitting blue light, and the color conversion layer 130 that converts blue light into light of different colors is disposed on some sub-pixels SP among the plurality of sub-pixels SP to thereby implement light of various colors.

Meanwhile, the plurality of LEDs 120 may be formed in various structures, such as a lateral structure, a vertical structure, and a flip-chip structure. The LED having a lateral structure includes a light emitting layer 122 and an N-type electrode and a P-type electrode that are laterally disposed on both sides of the light emitting layer 122. The LED having a lateral structure may emit light by combining electrons supplied to the light emitting layer 122 through the N-type electrode and holes supplied to the light emitting layer 122 through the P-type electrode. The LED having a vertical structure includes the light emitting layer 122, an N-type electrode and a P-type electrode disposed above and below the light emitting layer 122. The LED having a vertical structure can also emit light by a combination of electrons and holes supplied from the electrodes, like the LED having a lateral structure. The LED having a flip-chip structure has substantially the same structure as the LED having a lateral structure. However, the LED of the flip-chip structure may be directly attached to a printed circuit board or the like with omission of a medium such as a metal wire. Hereinafter, for convenience of explanation, it will be described assuming that the plurality of LEDs 120 have a flip-chip structure, but the present disclosure is not limited thereto.

The LED 120 includes a first semiconductor layer 121, the light emitting layer 122, a second semiconductor layer 123, a first electrode 124, and a second electrode 125.

The first semiconductor layer 121 is disposed on the first connection electrode CE1 and the second connection electrode CE2, and the second semiconductor layer 123 is disposed on the first semiconductor layer 121. The first semiconductor layer 121 and the second semiconductor layer 123 may be layers that are formed by implanting n-type impurities or p-type impurities into gallium nitride (GaN). For example, one of the first semiconductor layer 121 and the second semiconductor layer 123 may be a p-type semiconductor layer formed by implanting p-type impurities into gallium nitride, and the other thereof may be an n-type semiconductor layer formed by implanting n-type impurities into gallium nitride, but present disclosure is not limited thereto. The p-type impurity may be magnesium (Mg), zinc (Zn), beryllium (Be), or the like, and the n-type impurity may be silicon (Si), germanium (Ge), tin (Sn), or the like, but present disclosure is not limited thereto.

The light emitting layer 122 is disposed between the first semiconductor layer 121 and the second semiconductor layer 123. The light emitting layer 122 may receive holes and electrons from the first semiconductor layer 121 and the second semiconductor layer 123 to emit light. The light emitting layer 122 may have a single-layer or multi-quantum well (MQW) structure, for example, the light emitting layer 122 may be formed of indium gallium nitride (InGaN), gallium nitride (GaN) or the like, but the present disclosure is not limited thereto.

The first electrode 124 is disposed between the first connection electrode CE1 and the first semiconductor layer 121, and the second electrode 125 is disposed between the second connection electrode CE2 and the second semiconductor layer 123. The first electrode 124 is an electrode that electrically connects the first semiconductor layer 121 and the driving transistor DTR together with the first connection electrode CE1. The second electrode 125 is an electrode that electrically connects the second semiconductor layer 123 and the common line CL together with the second connection electrode CE2.

At this time, in order to bond the first electrode 124 and the second electrode 125 and the first connection electrode CE1 and the second connection electrode CE2 to each other, the first electrode 124, the second electrode 125, the first connection electrode CE1, and the second connection electrode CE2 may be formed of a eutectic metal. For example, the first electrode 124, the second electrode 125, the first connection electrode CE1, and the second connection electrode CE2 may be formed of tin (Sn), indium (In), zinc (Zn), lead (Pb), nickel (Ni), gold (Au), platinum (Pt), copper (Cu), or the like, but present disclosure is not limited thereto.

Accordingly, the LED 120 of each of the plurality of sub-pixels SP may emit light by a voltage applied from the driving transistor DTR and the common line CL since the first electrode 124 is connected to the driving transistor DTR through the first connection electrode CE1 and the second electrode 125 is connected to the common line CL through the second connection electrode CE2.

The bank 115 is disposed between the plurality of sub-pixels SP on the planarization layer 114. The bank 115 is disposed between each of the plurality of sub-pixels SP, so that it is possible to minimize or reduce a phenomenon in which light emitted from the plurality of sub-pixels SP travels to other sub-pixels SP and thus, causes color mixing. The bank 115 is disposed along a boundary between the plurality of sub-pixels SP and may have a mesh shape. For example, the bank 115 may be formed of an opaque resin including a pigment or the like, but is not limited thereto.

A plurality of the color conversion layers 130 are disposed to fill a space between the banks 115. The plurality of color conversion layers 130 are disposed between the banks 115 in each of the plurality of sub-pixels SP such that the banks 115 surround the plurality of color conversion layers 130. The plurality of color conversion layers 130 may be disposed to cover the plurality of LEDs 120 and fill the space between the banks 115. Light emitted from the plurality of LEDs 120 may be directed to the plurality of color conversion layers 130, and color conversion materials of the plurality of color conversion layers 130 may absorb light and emit light of different wavelengths. The plurality of color conversion layers 130 include a red color conversion layer 130R and a green color conversion layer 130G. Different color conversion materials may be distributed in each of the red color conversion layer 130R and the green color conversion layer 130G.

The red color conversion layer 130R is disposed in the red sub-pixel SPR among the plurality of sub-pixels SP. Blue light emitted from the LED 120 may pass through the red color conversion layer 130R and be converted into red light.

The green color conversion layer 130G is disposed in the green sub-pixel SPG among the plurality of sub-pixels SP.

The blue light emitted from the LED 120 may pass through the green color conversion layer 130G and be converted into green light.

In addition, instead of the color conversion layer 130, a transparent layer 131 is disposed in the blue sub-pixel SPB among the plurality of sub-pixels SP. Since the light emitted from the LED 120 is blue light, only the transparent layer 131 that transmits blue light may be formed in the blue sub-pixel SPB to allow the blue light from the LED 120 to be emitted upwardly of the substrate 110.

Meanwhile, each of the plurality of color conversion layers 130 includes a plurality of color conversion material layers 132R and 132G and a plurality of transparent layers 131 that are alternately stacked. The plurality of color conversion layers 130 may improve color conversion efficiency and color gamut by having the plurality of color conversion material layers 132R and 132G stacked therein while preventing luminance of the display device 100 from being lowered. Each of the plurality of LEDs may overlap all of the plurality of color conversion material layers, and a portion of areas between the plurality of LEDs and the banks 115 may overlap some color conversion material layers among the plurality of color conversion material layers. Hereinafter, the plurality of color conversion layers 130 will be described in more detail with reference to FIGS. 3 and 4.

Figure 3:
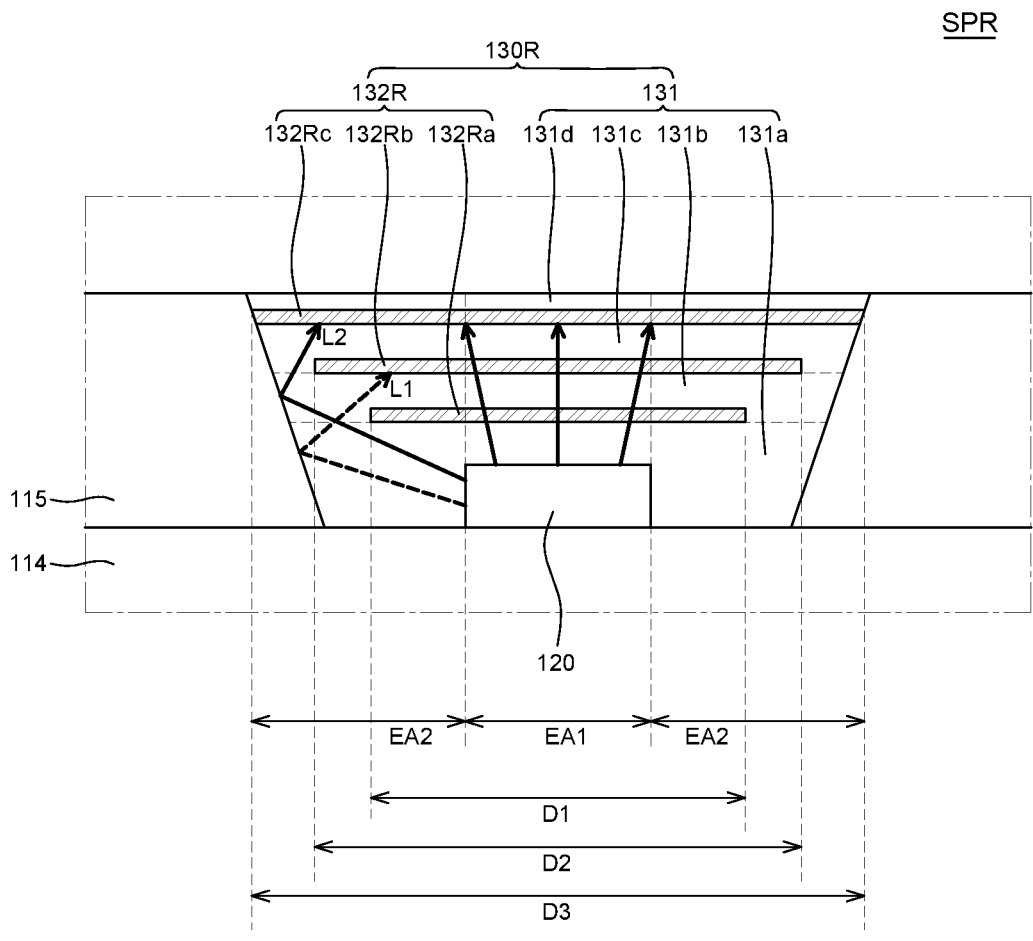
FIG. 3 is an enlarged cross-sectional view of a red sub-pixel of the display device according to an embodiment of the present disclosure.
Figure 4:
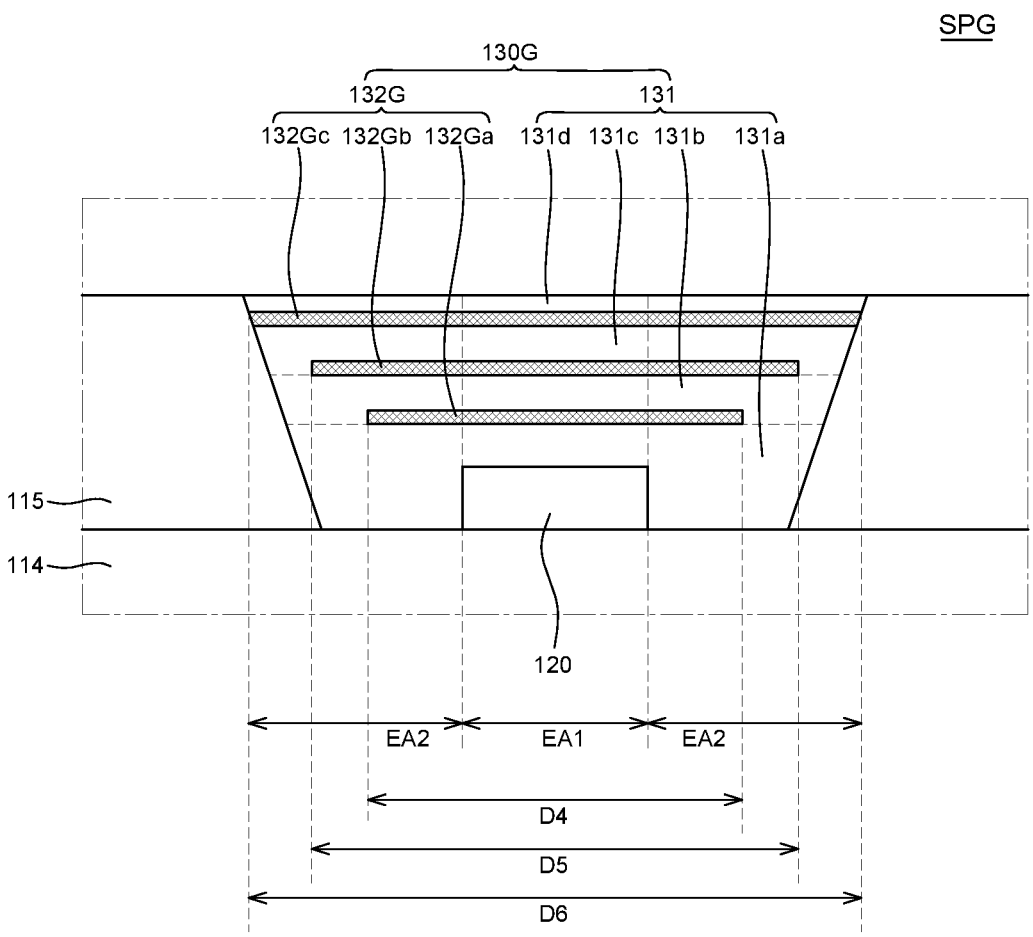
FIG. 4 is an enlarged cross-sectional view of a green sub-pixel of the display device according to an embodiment of the present disclosure.

FIG. 3 is an enlarged cross-sectional view of a red sub-pixel of the display device according to an embodiment of the present disclosure. FIG. 4 is an enlarged cross-sectional view of a green sub-pixel of the display device according to an embodiment of the present disclosure. In FIGS. 3 and 4, only the planarization layer 114, the LED 120, the banks 115, and the color conversion layer 130 among components of the display device 100 for convenience of explanation are shown, and the LED 120 is schematically shown.

Meanwhile, referring to FIGS. 3 and 4, each of the plurality of sub-pixels SP includes a first emission area EA1 and a second emission area EA2. The first emission areas EA1 and the second emission areas EA2 are areas between the banks 115, and are areas from which light emitted from the plurality of LEDs 120 is emitted.

The first emission areas EA1 are areas overlapping the plurality of LEDs 120. Since a majority of light emitted from the LED 120 travels upwardly of the LED 120, the majority of the light emitted from the LED 120 may be emitted to the first emission area EA1. The first emission areas EA1 may overlap all of the plurality of color conversion material layers 132R and 132G. In this case, since the light is most emitted upwardly of the LEDs 120, the majority of the light emitted from the LEDs 120 travels to the plurality of color conversion material layers 132R and 132G in the first emission areas EA1 or vicinities of the first emission areas EA1 and may be converted into light of a different color.

The second emission areas EA2 are areas that do not overlap the plurality of LEDs 120 and are remaining areas except for the first emission areas EA1. The majority of the light emitted from the plurality of LEDs 120 may be directed to the first emission areas EA1, and a remainder of the light may be directed to the second emission areas EA2. The plurality of color conversion material layers 132R and 132G may overlap only portions of the second emission areas EA2. That is, a partial area of the second emission area EA2 may overlap a portion of the plurality of color conversion material layers 132R and 132G. For example, referring to FIG. 3, a first red color conversion material layer 132Ra may overlap only a portion of the second emission area EA2. A second red color conversion material layer 132Rb may overlap only a portion of the second emission area EA2. And, a portion of the second red color conversion material layer 132Rb disposed in the second emission area EA2 may include a portion that protrudes outwardly from the first red color conversion material layer 132Ra and does not overlap the first red color conversion material layer 132Ra. That is, overlapping of a plurality of red color conversion material layers 132R may be reduced in the second emission area EA2.

Accordingly, in the first emission areas EA1 from which light is most strongly emitted, all of the plurality of color conversion material layers 132R and 132G may be disposed to overlap each other. And in the second emission areas EA2 from which light is emitted relatively weakly, only some color conversion material layers among the plurality of color conversion material layers 132R and 132G may overlap each other. Therefore, the plurality of color conversion material layers 132R and 132G may overlap each other more as they are adjacent to the first emission areas EA1, and the plurality of color conversion material layers 132R and 132G may overlap each other less as they far away from the first emission areas EA1. Areas of upper surfaces of the plurality of color conversion material layers 132R and 132G may increase as the plurality of color conversion material layers 132R and 132G are far away from the plurality of LEDs 120. Accordingly, in the display device 100 according to an embodiment of the present disclosure, a degree of overlap of the plurality of color conversion material layers 132R and 132G can be adjusted in consideration of areas where the light emitted from the plurality of LEDs 120 is emitted.

Referring to FIG. 3, the red color conversion layer 130R includes the plurality of red color conversion material layers 132R and the plurality of transparent layers 131. The plurality of transparent layers 131 and the plurality of red color conversion material layers 132R may be alternately disposed. The plurality of red color conversion material layers 132R may be disposed between each of the plurality of transparent layers 131 and may be surrounded by the plurality of transparent layers 131. The number and thickness of the plurality of red color conversion material layers 132R may be designed in consideration of color coordinates and light leakage of blue light. For example, when blue light emitted from the LED 120 is not converted to red light and is emitted outwardly of the red color conversion layer 130R, the number or thickness of the red color conversion material layer 132R may be increased. For example, when only a portion of blue light emitted from the LED 120 is converted into red light in the red color conversion layer 130R, the number or concentrations of the red color conversion material layers 132R may be increased to increase color conversion efficiency. Accordingly, when luminance decreases, the number of the red color conversion material layers 132R or the concentration of each of the red color conversion material layers 132R can be reduced, and when the color conversion efficiency is low, light leakage of blue light occurs, and color coordinate distortion occurs, the number of the red color conversion material layers 132R or the concentration of each of the red color conversion material layers 132R can be increased.

The plurality of red color conversion material layers 132R may include a plurality of red color conversion materials to convert light emitted from the LED 120 into red light. Centers of the plurality of red color conversion material layers 132R may overlap the first emission area EA1 and the LED 120. For example, the red color conversion material may be formed of a nano phosphor, an organic phosphor, quantum dots or the like and may absorb blue light emitted from the LED 120 to emit red light.

The transparent layers 131 may be disposed between the plurality of LEDs 120 and the plurality of color conversion material layers, between each of the plurality of color conversion material layers, and on the plurality of color conversion material layers. For example, the plurality of transparent layers 131 are disposed between the plurality of red color conversion material layers 132R. The plurality of transparent layers 131 may be formed of transparent resin. Accordingly, light emitted from the LED 120 or light converted by the plurality of red color conversion material layers 132R passes through the plurality of transparent layers 131 as they are, and may travel to the other red color conversion material layers 132R or outwardly of the red color conversion layer 130R.

Hereinafter, for convenience of explanation, descriptions are made assuming that the plurality of red color conversion material layers 132R include the first red color conversion material layer 132Ra, the second red color conversion material layer 132Rb, and a third red color conversion material layer 132Rc and the plurality of transparent layers 131 include a first transparent layer 131a, a second transparent layer 131b, a third transparent layer 131c, and a fourth transparent layer 131d, but the number of the plurality of red color conversion material layers 132R and the number of the plurality of transparent layers 131 are not limited thereto.

First, the first transparent layer 131a is disposed on the LED 120. The first transparent layer 131a may entirely cover an upper portion of the LED 120 and fill the space between the banks 115. The first transparent layer 131a may support the plurality of red color conversion material layers 132R formed on the first transparent layer 131a to be formed flat.

The first red color conversion material layer 132Ra is disposed on the first transparent layer 131a. The first red color conversion material layer 132Ra is disposed on the first transparent layer 131a to overlap the LED 120. In this case, the first red color conversion material layer 132Ra may cover only a portion of a central area of an upper surface of the first transparent layer 131a overlapping the LED 120 without entirely covering the upper surface of the first transparent layer 131a. The center of the first red color conversion material layer 132Ra may overlap the first emission area EA1 and the LED 120. Since a majority of light emitted from the LED 120 is directed upwardly of the LED 120, the first red color conversion material layer 132Ra may be disposed to overlap the LED 120.

The second transparent layer 131b is disposed on the first transparent layer 131a and the first red color conversion material layer 132Ra. The second transparent layer 131b may fill the space between the banks 115 on the first red color conversion material layer 132Ra. The second transparent layer 131b is a layer for securing a gap between the first red color conversion material layer 132Ra and the second red color conversion material layer 132Rb, and the gap between the first red color conversion material layer 132Ra and the second red color conversion material layer 132Rb may be varied according to a thickness of the second transparent layer 131b. In addition, a portion of blue light that is not converted into red light in the first red color conversion material layer 132Ra may be easily directed to the second red color conversion material layer 132Rb through the second transparent layer 131b on which the color conversion material is not disposed.

In addition, red light that is converted in the first red color conversion material layer 132Ra may easily travel outwardly of the red color conversion layer 130R through the second transparent layer 131b. If there are no transparent layers 131 between the plurality of color conversion material layers 132R, the red light that is converted in the first red color conversion material layer 132Ra is covered by the color conversion materials of the rest of the plurality of red color conversion material layers 132R and may not travel outwardly of the red color conversion layer 130R, or the probability that the red light that is converted in the first red color conversion material layer 132Ra is lost in a process of being reflected by the color conversion material may increase. Accordingly, by disposing the transparent layers 131 between the plurality of red color conversion material layers 132R, the possibility that the converted red light is lost may be reduced.

The second red color conversion material layer 132Rb is disposed on the second transparent layer 131b. The second red color conversion material layer 132Rb is disposed on the second transparent layer 131b to overlap the LED 120. The second red color conversion material layer 132Rb may not entirely cover an upper surface of the second transparent layer 131b. The second red color conversion material layer 132Rb may cover a portion of a central area of the upper surface of the second transparent layer 131b overlapping the LED 120. The second red color conversion material layer 132Rb may not cover an outer portion of the second transparent layer 131b adjacent to the bank 115. In this case, an area of an upper surface of the second red color conversion material layer 132Rb may be greater than an area of an upper surface of the first red color conversion material layer 132Ra. For example, a width D2 of the second red color conversion material layer 132Rb may be greater than a width D1 of the first red color conversion material layer 132Ra. An edge of the second red color conversion material layer 132Rb may be disposed closer to the bank 115 than an edge of the first red color conversion material layer 132Ra. In this case, a portion of the second red color conversion material layer 132Rb may overlap a space between the first red color conversion material layer 132Ra and the bank 115.

The second red color conversion material layer 132Rb is formed to be greater than the first red color conversion material layer 132Ra and may convert a portion of blue light passing through an empty space between the first red color conversion material layer 132Ra and the bank 115 into red light. For example, among the light emitted from the LED 120, first light L1 travels toward the empty space between the first red color conversion material layer 132Ra and the bank 115, and even if the first light L1 is not converted into red light, it is incident on the second red color conversion material layer 132Rb having a size greater than that of the first red color conversion material layer 132Ra and may be converted into red light.

The third transparent layer 131c is formed on the second red color conversion material layer 132Rb. The third transparent layer 131c may fill the space between the banks 115 on the second red color conversion material layer 132Rb. The third transparent layer 131c is a layer for securing a gap between the second red color conversion material layer 132Rb and the third red color conversion material layer 132Rc. The gap between the second red color conversion material layer 132Rb and the third red color conversion material layer 132Rc may be varied according to a thickness of the third transparent layer 131c. In addition, a portion of blue light that is not converted into red light in the second red color conversion material layer 132Rb may be easily directed to the third red color conversion material layer 132Rc through the third transparent layer 131c on which the color conversion material is not disposed.

In addition, red light that is converted in the first red color conversion material layer 132Ra and the second red color conversion material layer 132Rb may easily travel outwardly of the red color conversion layer 130R through the third transparent layer 131c. The transparent layers 131 are disposed between the plurality of color conversion material layers 132R, so that a phenomenon in which the red light converted in the first red color conversion material layer 132Ra and the second red color conversion material layer 132Rb is covered by the color conversion materials of the third red color conversion material layer 132Rc and may not travel outwardly of the red color conversion layer 130R, may be reduced or light that is lost in a process of being reflected by the color conversion material may be reduced.

The third red color conversion material layer 132Rc is disposed on the third transparent layer 131c. The third red color conversion material layer 132Rc is disposed on the third transparent layer 131c to overlap the LED 120. The third red color conversion material layer 132Rc disposed at an uppermost portion may have a greatest size among the plurality of red color conversion material layers 132R. An area of an upper surface of a color conversion material layer at a lowermost portion may be smaller than an area of an upper surface of a color conversion material layer at an uppermost portion. For example, a width D3 of the third red color conversion material layer 132Rc may be greater than each of the width D1 of the first red color conversion material layer 132Ra and the width D2 of the second red color conversion material layer 132Rb.

The color conversion material layer at the uppermost portion may entirely cover an upper surface of a transparent layer under the color conversion material layer at the uppermost portion among the plurality of transparent layers 131. For example, the third red color conversion material layer 132Rc may entirely cover an upper surface of the third transparent layer 131c that is directly under the third red color conversion material layer 132Rc, unlike the second red color conversion material layer 132Rb or the first red color conversion material layer 132Ra. The third red color conversion material layer 132Rc entirely covers an upper surface of the third transparent layer 131c so that a phenomenon in which a portion of blue light that is not converted to red light among the light emitted from the LED 120 travels outwardly of the red color conversion layer 130R can be minimized or reduced. For example, even if second light L2 among the light emitted from the plurality of LEDs 120 is not converted into red light in the first red color conversion material layer 132Ra and the second red color conversion material layer 132Rb, it may be converted into red light by the third red color conversion material layer 132Rc that covers an entirety of the first emission area EA1 and the second emission area EA2.

If the third red color conversion material layer 132Rc covers only a portion of the third transparent layer 131c, there occurs blue light leakage in which blue light travels outwardly of the red color conversion layer 130R through an empty space in which the third red color conversion material layer 132Rc is not disposed, so that color conversion efficiency and display quality may be degraded. Accordingly, the third red color conversion material layer 132Rc disposed on an uppermost portion among a plurality of red color conversion material layers 132R may be disposed over an entirety of the first emission area EA1 and the second emission area EA2 so that there is no empty space between the banks 115 and the third red color conversion material layer 132Rc.

The fourth transparent layer 131d is disposed on the third red color conversion material layer 132Rc. The fourth transparent layer 131d may protect the third red color conversion material layer 132Rc from the outside. The fourth transparent layer 131d may be disposed to entirely fill an inner space of the banks 115 and protect the third red color conversion material layer 132R. However, the fourth transparent layer 131d may be omitted, but is not limited thereto.

Referring to FIG. 4, the green color conversion layer 130G includes a plurality of green color conversion material layers 132G and a plurality of transparent layers 131. The plurality of transparent layers 131 and the plurality of green color conversion material layers 132G may be alternately disposed. In this case, the plurality of transparent layers 131 are substantially the same as the transparent layers 131 of the red color conversion layer 130R.

In addition, the plurality of green color conversion material layers 132G may include a plurality of green color conversion materials to convert light emitted from the LED 120 into green light. For example, the green color conversion material may be formed of a nano phosphor, an organic phosphor, quantum dots, or the like and may absorb blue light emitted from the LED 120 to emit green light.

Hereinafter, for convenience of explanation, descriptions are made assuming that the plurality of green color conversion material layers 132G include a first green color conversion material layer 132Ga, a second green color conversion material layer 132Gb, and a third green color conversion material layer 132Gc and the plurality of transparent layers 131 include the first transparent layer 131a, the second transparent layer 131b, the third transparent layer 131c, and the fourth transparent layer 131d, but the number of the green color conversion material layers 132G and the plurality of transparent layers 131 is not limited thereto.

The first transparent layer 131a is disposed on the LED 120, and the first green color conversion material layer 132Ga is disposed on the first transparent layer 131a. The first green color conversion material layer 132Ga is disposed to overlap the LED 120. The first green color conversion material layer 132Ga may be mainly disposed on the central area of the upper surface of the first transparent layer 131a overlapping the LED 120. The first green color conversion material layer 132Ga may not be disposed on an outer portion of the first transparent layer 131a adjacent to the bank 115.

The second transparent layer 131b is disposed on the first green color conversion material layer 132Ga, and the second green color conversion material layer 132Gb is disposed on the second transparent layer 131b. The second green color conversion material layer 132Gb is disposed on the second transparent layer 131b to overlap the LED 120. The second green color conversion material layer 132Gb may cover a portion of the central area of the upper surface of the second transparent layer 131b overlapping the LED 120. The second green color conversion material layer 132Gb may not be disposed on an outer portion of the second transparent layer 131b adjacent to the bank 115. In this case, the second green color conversion material layer 132Gb may be formed to be greater than the first green color conversion material layer 132Ga. The second green color conversion material layer 132Gb is formed to have a size greater than the first green color conversion material layer 132Ga, and may overlap a portion of an empty space between the first green color conversion material layer 132Ga and the bank 115. For example, a width D5 of the second green color conversion material layer 132Gb may be greater than a width D4 of the first green color conversion material layer 132Ga.

The third transparent layer 131c is disposed on the second green color conversion material layer 132Gb, and the third green color conversion material layer 132Gc is disposed on the third transparent layer 131c. The third green color conversion material layer 132Gc is disposed to entirely cover the upper surface of the third transparent layer 131c. The third green color conversion material layer 132Gc may have a greatest size among the plurality of green color conversion material layers 132G. For example, a width D6 of the third green color conversion material layer 132Gc may be greater than each of the width D4 of the first green color conversion material layer 132Ga and the width D5 of the second green color conversion material layer 132Gb.

The third green color conversion material layer 132Gc is disposed to entirely cover a space between the banks 115 so that a phenomenon in which among blue light emitted from the LED 120, a portion of the blue light that is not converted passes into green light through the third green color conversion material layer 132Gc and travels outwardly of the banks 115 may be minimized or reduced. Since the third green color conversion material layer 132Gc at an uppermost portion is disposed to overlap both the first emission area EA1 and the second emission area EA2, leakage of blue light from the third green color conversion material layer 132Gc is minimized or reduced, so that color conversion efficiency and color purity may be improved. Accordingly, a size of the third green color conversion material layer 132Gc disposed at an uppermost portion among the plurality of green color conversion material layers 132G may be greatest.

Accordingly, in the display device 100 according to an embodiment of the present disclosure, a plurality of color conversion material layers that are spaced apart from each other by the plurality of transparent layers 131 are disposed on the LED 120, so that it is possible to minimize or reduce light that is lost inside the color conversion layer 130 and improve color conversion efficiency of blue light. The transparent layers 131 are disposed between the plurality of color conversion material layers 132R and 132G, so that a portion occupied by the plurality of color conversion material layers 132R and 132G in an entirety of the color conversion layer 130 is reduced, and a probability that red light already converted in the conversion material layers 132R and 132G is lost or is not extracted to the outside of the color conversion layer 130 may be reduced. Accordingly, by disposing the plurality of transparent layers 131, among light that is converted in the plurality of color conversion material layers 132R and 132G, light that is lost in a process of being absorbed or reflected by the color conversion material may be reduced, and luminance of the display device 100 and color conversion efficiency of the color conversion layer 130 may be improved.

Hereinafter, color conversion efficiency and effects of the color conversion layer 130 of the display device 100 according to an embodiment of the present disclosure will be described in detail with reference to a display device 10 according to a comparative example and display devices 100 and 200 according to Examples.

Figure 5A:
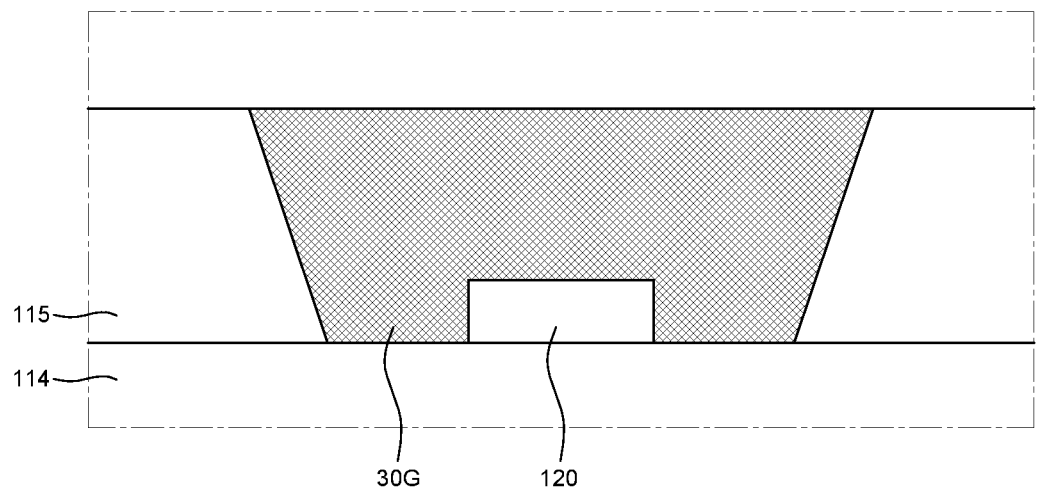
FIG. 5A is a cross-sectional view of a green sub-pixel of a display device according to a comparative example.
Figure 5B:
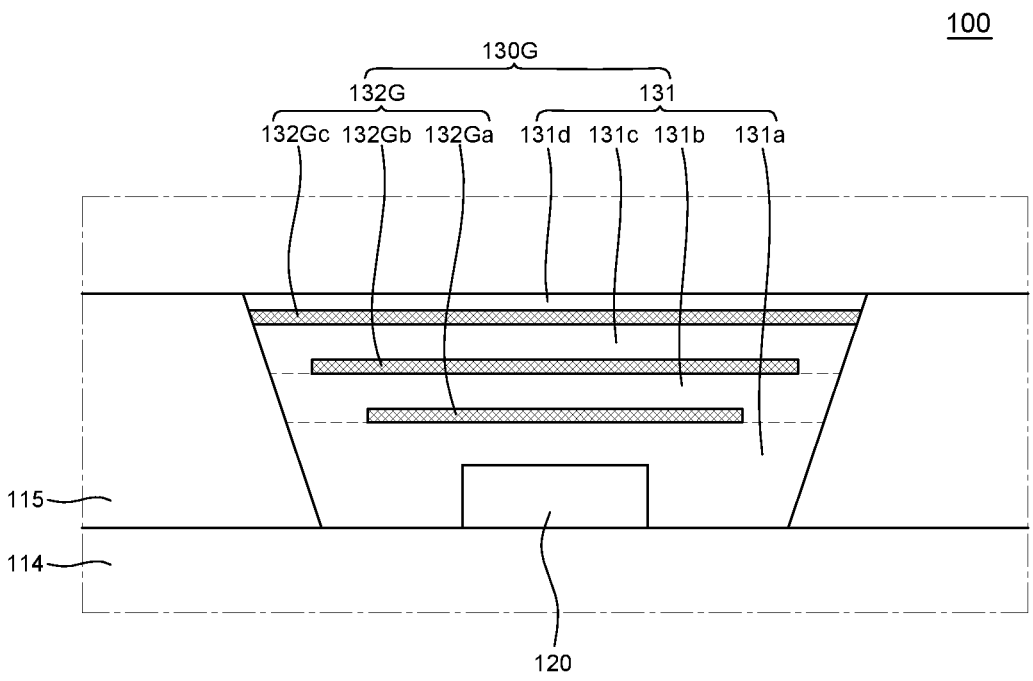
FIG. 5B is a cross-sectional view of a green sub-pixel of a display device according to Example 1.
Figure 5C:
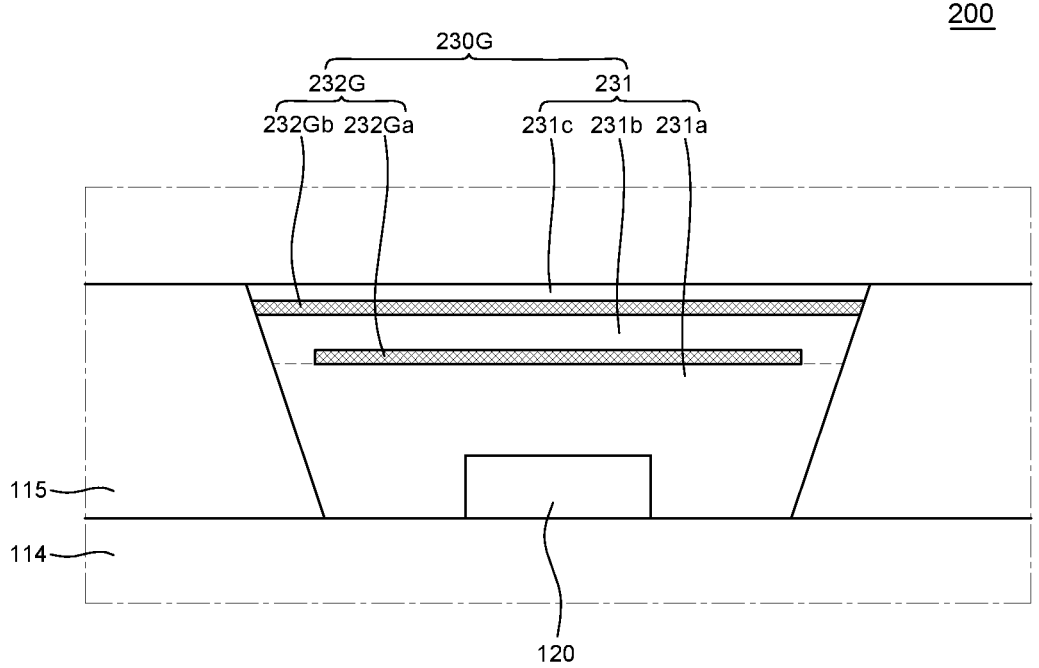
FIG. 5C is a cross-sectional view of a green sub-pixel of a display device according to Example 2.

FIG. 5A is a cross-sectional view of a green sub-pixel of a display device according to a comparative example. FIG. 5B is a cross-sectional view of a green sub-pixel of a display device according to Example 1. FIG. 5C is a cross-sectional view of a green sub-pixel of a display device according to Example 2. FIGS. 5A to 5C show green color conversion layers 30G, 130G, and 230G of the green sub-pixel SPG for convenience of explanation, but the same simulation results of the red color conversion layer 130Ra as those of the green color conversion layer 130G can also be confirmed.

The green color conversion layer 30G of the display device 10 according to the comparative example includes one green color conversion layer 30G without the plurality of transparent layers 131. The green color conversion layer 130G of the display device 100 according to the Example 1 includes three green color conversion material layers 132G and four transparent layers 131, and has substantially the same structure as the display device 100 according to an embodiment of the present disclosure. The green color conversion layer 230G of the display device 200 according to the Example 2 includes two green color conversion material layers 232G and three transparent layers 231.

In each of the display device 10 according to the comparative example, the display device 100 according to the Example 1, and the display device 200 according to the Example 2, a size of the LED 120 is 10 μm in width, 10 μm in length, and 2 μm in height, and thicknesses of the banks 115 are equally 10 μm.

First, referring to FIG. 5A, the green color conversion layer 30G of the display device 10 according to the comparative example has no transparent layer and includes only one green color conversion material layer. In this case, a thickness of the green color conversion layer 30G is 10 μm, and may be configured to have the same thickness as the bank 115. In the display device 10 according to the comparative example, one green color conversion material layer is formed in a space between the banks 115 and converts light emitted from the LED 120 into green light.

Referring to FIG. 5B, the green color conversion layer 130G of the display device 100 according to the Example 1 has a structure in which the first transparent layer 131a, the first green color conversion material layer 132Ga, the second transparent layer 131b, the second green color conversion material layer 132Gb, the third transparent layer 131c, the third green color conversion material layer 132Gc, and the fourth transparent layer 131d are stacked. Each of the plurality of green color conversion material layers 132G has a thickness of 0.5 μm. Accordingly, a total thickness of the plurality of green color conversion material layers 132G in the green color conversion layer 130G of the display device 100 according to the Example 1 may be about 1.5 μm.

Referring to FIG. 5C, the green color conversion layer 230G of the display device 200 according to the Example 2 has a structure in which a first transparent layer 231a, a first green color conversion material layer 232Ga, a second transparent layer 231b, a second green color conversion material layer 232Gb and a third transparent layer 231c are stacked. Each of a plurality of green color conversion material layers 232G has a thickness of 0.5 μm. Accordingly, a total thickness of the plurality of green color conversion material layers 232G in the green color conversion layer 230G of the display device 200 according to the Example 2 may be about 1.0 μm.

Meanwhile, as results of simulation confirming luminance of green light that is converted in the green color conversion layers 30G, 130G, and 230G of the display device 10 according to the comparative example, the display device 100 according to the Example 1, and the display device 200 according to the Example 2, results shown in Table 1 below can be confirmed. Specifically, Table 1 shows, luminance increase/decrease rates of green light extracted outwardly of the green color conversion layer 130G in the display device

100 according to Example 1 and luminance increase/decrease rates of green light extracted outwardly of the green color conversion layer 230G in the display device 200 according to the Example 2, when the luminance of green light that is extracted outwardly of the green color conversion layer 30G in the display device 10 according to the comparative example is set to 100%.

TABLE 1

| Display devices | Luminous Intensity (cd) | Increase/Decrease Rate (%) |
|---|---|---|
| Comparative Example | 0.175 | 100 |
| Example 1 | 0.204 | 116.6 |
| Example 2 | 0.214 | 122.3 |

Referring to Table 1, when luminance of green light is set to 100% in the display device 10 according to the comparative example, it is confirmed that the luminance of green light is increased to about 116.6% and 122.3% in Example 1 and Example 2, respectively.

Specifically, in the display device 10 according to the comparative example, only the green color conversion layer 30G without the transparent layers 131 exists. In this case, even if blue light emitted from the LED 120 is converted to green light in the green color conversion layer 30G, it is covered by surrounding green color conversion materials and cannot be extracted to the outside of the green color conversion layer 30G. In addition, in a process in which the converted green light travels outwardly of the green color conversion layer 30G, it is lost or reabsorbed by being reflected by the green color conversion material, so that color conversion efficiency may be lowered. Accordingly, among the display devices 10, 100, and 200 according to the comparative example and Example 1 and Example 2, the green color conversion layer 30G of the display device 10 according to the comparative example has a greatest thickness and has a greatest amount of green color conversion materials disposed therein, but the light is lost due to a high concentration of the green color conversion materials, so that luminance of the display device 10 can decrease.

Unlike this, in the green color conversion layers 130G and 230G of the display devices 100 and 200 according to the Example 1 and Example 2, total thicknesses of the plurality of green color conversion material layers 132G and 232G are less than a total thickness of the green color conversion layer 30G of the display device 10 according to the comparative example, but color conversion efficiency thereof can be more excellent and luminance thereof can also be improved.

Specifically, the green color conversion layers 130G and 230G of the display devices 100 and 200 according to the Example 1 and Example 2 include the plurality of green color conversion material layers 132G and 232G that are spaced apart from each other with the plurality of transparent layers 131 and 231 interposed therebetween. At this time, since the thickness of each of the plurality of green color conversion material layers 132G and 232G is small, a probability that green light that is converted in the green color conversion material layers 132G and 232G passes through the green color conversion material layers 132G and 232G and are lost or reabsorbed by the green color conversion materials can be reduced. In addition, a possibility that the converted green light is covered by the green color conversion materials of the green color conversion material layers 132G and 232G and cannot be extracted to the outside of the green color conversion layers 130G and 230G can also be reduced. In addition, since the plurality of transparent layers 131 and 231 are disposed between the green color conversion material layers 132G and 232G, a possibility that green light that is converted in the green color conversion material layers 132G and 232G is lost is also reduced, and the light may be easily directed to the outside of the green color conversion layers 130G and 230G through the transparent layers 131 and 231. Accordingly, in the display devices 100 and 200 according to the Example 1 and Example 2, the plurality of green color conversion material layers 132G and 232G having a small thickness are disposed, so that it is possible to minimize or reduce a case in which the converted green light cannot be extracted to the outside of the green color conversion material layers 132G and 232G and it is possible to improve color conversion efficiency and luminance.

Accordingly, in the display device 100 according to an embodiment of the present disclosure, the light lost inside the color conversion layer 130 may be minimized or reduced by using the color conversion layer 130 in which a plurality of thin color conversion material layers are stacked, and color conversion efficiency and luminance can be improved. The color conversion layer 130 includes the plurality of color conversion material layers 132R and 132G disposed to be spaced apart from each other with the plurality of transparent layers 131 interposed therebetween. Since the thickness of each of the plurality of color conversion material layers 132R and 132G is small, a probability that the converted light is lost or reabsorbed by the color conversion material may be low, and a probability that the converted light may not travel to the outside of the color conversion layer 130 by the color conversion material may be low. In addition, the converted light can easily travel to the outside of the color conversion layer 130 through the plurality of transparent layers 131 between the plurality of color conversion material layers 132R and 132G, so that the color conversion efficiency of the color conversion layer 130 and luminance of the display device 100 may be improved. For example, when the green color conversion layer 30G having a great thickness is used without the transparent layer 131 as in the display device 10 according to comparative example, light lost inside the green color conversion layer 30G increases, so that the luminance of the display device may decrease. Unlike this, in the display devices 100 and 200 according to the Example 1 and Example 2 using the plurality of green color conversion material layers 132G and 232G having a small thickness, it can be confirmed that overall thicknesses of the green color conversion material layers 132G and 232G are reduced, but color conversion efficiency and luminance are improved. Accordingly, in the display device 100 according to an embodiment of the present disclosure, by using the color conversion layer 130 in which the plurality of color conversion material layers 132R and 132G and the plurality of transparent layers 131 are alternately disposed, light lost inside the color conversion layer 130 can be minimized or reduced and the color conversion efficiency of the color conversion layer 130 and the luminance of the display device 100 can be improved.

In addition, in the display device 100 according to an embodiment of the present disclosure, the plurality of color conversion material layers 132R and 132G are intensively disposed on the upper portion of the LED 120 from which light is emitted most strongly from the LED 120, so that color conversion efficiency can be improved. Each of the plurality of color conversion material layers 132R and 132G has different sizes, but may be disposed to overlap the plurality of LEDs 120. In this case, since all the plurality of color conversion material layers 132R and 132G overlap on upper portions of the LEDs 120 from which light is emitted most strongly from the LEDs 120, a majority of the light emitted from the LEDs 120 may be converted into different colors of light in the plurality of color conversion material layers 132R and 132G. In addition, since sizes of the plurality of color conversion material layers 132R and 132G gradually increase toward the upper portions of the LEDs 120, blue light that is not converted in the color conversion material layers 132R and 132G at lower positions may be converted into light of different colors in the conversion material layers 132R and 132G at upper positions. Accordingly, a light leakage phenomenon in which the light emitted from the LED 120 is not converted in the color conversion layer 130 and leaks out of the color conversion layer 130 as it is can be minimized or reduced, and color coordinate distortion can be minimized or reduced.

The embodiments of the present disclosure can also be described as follows:

According to an aspect of the present disclosure, there is provided a display device. The display device includes a substrate on which a plurality of sub-pixels are defined, a plurality of LEDs disposed in each of the plurality of sub-pixels, and a plurality of color conversion layers covering the plurality of LEDs. The plurality of color conversion layers each includes a plurality of color conversion material layers that are stacked to be spaced apart from each other.

Each of the plurality of color conversion layers may further include a plurality of transparent layers disposed between the plurality of LEDs and the plurality of color conversion material layers, between each of the plurality of color conversion material layers, and on the plurality of color conversion material layers.

The plurality of transparent layers may surround each of the plurality of color conversion material layers.

Areas of upper surfaces of the plurality of color conversion material layers may increase as the plurality of color conversion material layers are far away from the plurality of LEDs.

Among the plurality of color conversion material layers, an area of an upper surface of a color conversion material layer at a lowermost portion may be smaller than an area of an upper surface of a color conversion material layer at an uppermost portion.

The color conversion material layer at the uppermost portion entirely may cover an upper surface of a transparent layer under the color conversion material layer at the uppermost portion among the plurality of transparent layers.

The display device may further include banks disposed between the plurality of sub-pixels to surround the plurality of color conversion layers. Each of the plurality of LEDs may overlap all of the plurality of color conversion material layers, and a portion of areas between the plurality of LEDs and the banks may overlap some color conversion material layers among the plurality of color conversion material layers.

The plurality of sub-pixels may include a red sub-pixel, a green sub-pixel, and a blue sub-pixel. The plurality of LEDs may be blue LEDs, the plurality of color conversion layers may include a red color conversion layer disposed on the red sub-pixel and a green color conversion layer disposed on the green sub-pixel.

The red color conversion layer may include a red color conversion material layer disposed between each of the plurality of transparent layers, and the green color conversion layer may include a green color conversion material layer disposed between each of the plurality of transparent layers.

According to another aspect of the present disclosure, there is provided a display device. The display device includes a substrate on which a plurality of sub-pixels including first emission areas and second emission areas are defined, LEDs disposed in the first emission areas, and color conversion layers covering the LEDs in the plurality of sub-pixels and each including a plurality of color conversion material layers spaced apart from each other. The first emission area overlaps all of the plurality of color conversion material layers, and a partial area of the second emission area overlaps a portion of the plurality of color conversion material layers.

The plurality of color conversion material layers may include first color conversion material layers disposed on a plurality of the LEDs, and second color conversion material layers disposed on the first color conversion material layers. A center of each of the first color conversion material layer and the second color conversion material layer may overlap the first emission area.

The display device may further include banks disposed between the plurality of sub-pixels on the substrate and surrounding each of the plurality of color conversion layers. An edge of the second color conversion material layer may be disposed closer to the bank than an edge of the first color conversion material layer.

Among light emitted from the LED, light that is not converted into light of a different color in the first color conversion material layer may be converted into light of a different color in the second color conversion material layer.

Among the plurality of color conversion material layers, when the second color conversion material layer is disposed at an uppermost portion, the second color conversion material layer may overlap both the first emission area and the second emission area.

The color conversion layer may further include a first transparent layer disposed between the LED and the first color conversion material layer, a second transparent layer disposed between the first color conversion material layer and the second color conversion material and layer, a third transparent layer disposed on the second color conversion material layer.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
a substrate on which a plurality of sub-pixels are defined;
a plurality of transistors disposed in the plurality of sub-pixels and including an active layer, a source electrode and a drain electrode;
an organic layer disposed on the plurality of transistors;

a plurality of light emitting diodes (LEDs) disposed on the organic layer in the plurality of sub-pixels;
a first connection electrode disposed between the organic layer and each of the plurality of LEDs; and
a plurality of color conversion layers covering the plurality of LEDs,
wherein each of the plurality of color conversion layers includes:
a plurality of color conversion material layers that are stacked to be spaced apart from each other; and
a plurality of transparent layers disposed between the plurality of LEDs and the plurality of color conversion material layers, between each of the plurality of color conversion material layers, and on the plurality of color conversion material layers, and
wherein a first electrode of each of the plurality of LEDs is electrically connected to each of the plurality of transistors through the first connection electrode formed by penetrating the organic layer.

2. The display device of claim 1, wherein the plurality of transparent layers surround each of the plurality of color conversion material layers.

3. The display device of claim 1, wherein areas of upper surfaces of the plurality of color conversion material layers increase as the plurality of color conversion material layers are farther away from the plurality of LEDs.

4. The display device of claim 3, wherein among the plurality of color conversion material layers, an area of an upper surface of a color conversion material layer at a lowermost portion is smaller than an area of an upper surface of a color conversion material layer at an uppermost portion.

5. The display device of claim 4, wherein the color conversion material layer at the uppermost portion entirely covers an upper surface of a transparent layer under the color conversion material layer at the uppermost portion among the plurality of transparent layers.

6. The display device of claim 3, further comprising:
banks disposed between the plurality of sub-pixels to surround the plurality of color conversion layers,
wherein each of the plurality of LEDs overlaps all of the plurality of color conversion material layers, and
a portion of areas between the plurality of LEDs and the banks overlaps one or more color conversion material layers among the plurality of color conversion material layers.

7. The display device of claim 1, wherein the plurality of sub-pixels include a red sub-pixel, a green sub-pixel, and a blue sub-pixel;
wherein the plurality of LEDs are blue LEDs,
wherein the plurality of color conversion layers include a red color conversion layer disposed on the red sub-pixel and a green color conversion layer disposed on the green sub-pixel.

8. The display device of claim 7, wherein the red color conversion layer includes a red color conversion material layer disposed between each of the plurality of transparent layers, and
the green color conversion layer includes a green color conversion material layer disposed between each of the plurality of transparent layers.

9. The display device of claim 3, wherein among the plurality of color conversion material layers, a width of a color conversion material layer at an uppermost portion is greater than a width of a color conversion material layer at a lowermost portion.

10. The display device of claim 1, wherein each of the plurality of color conversion layers further includes a plurality of transparent layers which are alternately stacked with the plurality of color conversion material layers.

11. A display device, comprising:
a substrate on which a plurality of sub-pixels including first emission areas and second emission areas are defined;
a plurality of transistors disposed in the plurality of sub-pixels and including an active layer, a source electrode and a drain electrode;
an organic layer disposed on the plurality of transistors;
light emitting diodes (LEDs) disposed on the organic layer in the first emission areas;
a first connection electrode disposed between the organic layer and the LEDs;
color conversion layers covering the LEDs in the plurality of sub-pixels and each including a plurality of color conversion material layers spaced apart from each other; and
a bank disposed between the plurality of sub-pixels on the substrate and surrounding each of the color conversion layers,
wherein the first emission area overlaps all of the plurality of color conversion material layers,
wherein a partial area of the second emission area overlaps a portion of the plurality of color conversion material layers,
wherein the plurality of color conversion material layers each includes:
a first color conversion material layer disposed on the LEDs; and
a second color conversion material layer disposed on the first color conversion material layer,
wherein a center of each of the first color conversion material layer and the second color conversion material layer overlaps the first emission area,
wherein an edge of the second color conversion material layer is disposed closer to the bank than an edge of the first color conversion material layer, and
wherein a first electrode of each of the LEDs is electrically connected to each of the plurality of transistors through the first connection electrode formed by penetrating the organic layer.

12. The display device of claim 11, wherein among light emitted from the LED, light that is not converted into light of a different color in the first color conversion material layer is converted into light of a different color in the second color conversion material layer.

13. The display device of claim 11, wherein among the plurality of color conversion material layers, when the second color conversion material layer is disposed at an uppermost portion, the second color conversion material layer overlaps both the first emission area and the second emission area.

14. The display device of claim 11, wherein the color conversion layers each further includes,
a first transparent layer disposed between the LED and the first color conversion material layer;
a second transparent layer disposed between the first color conversion material layer and the second color conversion material layer; and
a third transparent layer disposed on the second color conversion material layer.

15. The display device of claim 11, wherein the second emission areas are areas that do not overlap the plurality of LEDs and are remaining areas except for the first emission areas.

16. The display device of claim 14, wherein the first transparent layer entirely covers an upper portion of the LED.

17. The display device of claim 14, wherein the plurality of color conversion layers each further includes a third color conversion material layer disposed on the third transparent layer,
wherein the third color conversion material layer entirely covers an upper surface of the third transparent layer that is directly under the third color conversion material layer.

18. The display device of claim 17, wherein the plurality of color conversion layers each further includes a fourth transparent layer disposed on the third color conversion material layer.

19. The display device of claim 11, wherein an area of an upper surface of the second color conversion material layer is greater than an area of an upper surface of the first color conversion material layer.

20. The display device of claim 11, wherein a width of the second color conversion material layer is greater than a width of the first color conversion material layer.

21. The display device of claim 11, wherein the plurality of color conversion layers each further includes a plurality of transparent layers which are alternately stacked with the plurality of color conversion material layers.

* * * * *